United States Patent [19]

Chen

[11] 4,122,413
[45] Oct. 24, 1978

[54] ACCURATE SINGLE PIN MOS RC OSCILLATOR

[75] Inventor: Carson L. Chen, San Bruno, Calif.

[73] Assignee: National Semiconductor Corporation, Santa Clara, Calif.

[21] Appl. No.: 735,913

[22] Filed: Oct. 26, 1976

[51] Int. Cl.² .......................................... H03K 3/353
[52] U.S. Cl. ................................. 331/108 D; 331/111; 331/113 R
[58] Field of Search ............... 331/108 D, 111, 113 R, 331/108 C

[56] References Cited

U.S. PATENT DOCUMENTS

| 3,659,224 | 4/1972 | Ball | 331/111 |
| 3,883,825 | 5/1975 | Cohen | 331/111 |
| 3,921,101 | 11/1975 | McCoy et al. | 331/108 D |
| 3,995,232 | 11/1976 | Laugesen | 331/108 D X |
| 4,001,722 | 1/1977 | Patel et al. | 331/108 D X |

Primary Examiner—Siegfried H. Grimm
Attorney, Agent, or Firm—Gail W. Woodward

[57] ABSTRACT

A series resistor-capacitor combination is coupled across a source of supply potential so that the capacitor will charge toward the supply potential through the resistor. The capacitor is discharged through a shunt connected switch that is operated by means of a latch. A pair of inverters coupled to the capacitor respond to the capacitor charge and operate through logic means to set and reset the latch. The inverters are made to have similar but different thresholds. When the capacitor charge is below both thresholds, the latch is set to turn the switch off so that the capacitor charges. When both thresholds are exceeded, the logic resets the latch to turn the switch on and discharge the capacitor. The capacitor therefore normally charges and discharges between the two thresholds and this threshold difference parameter is substantially independent of circuit fabrication variables.

5 Claims, 3 Drawing Figures

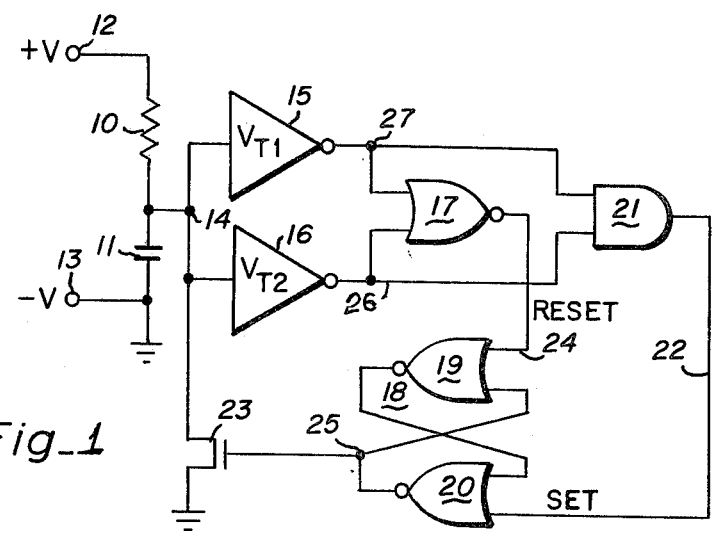
Fig_1
Fig_2
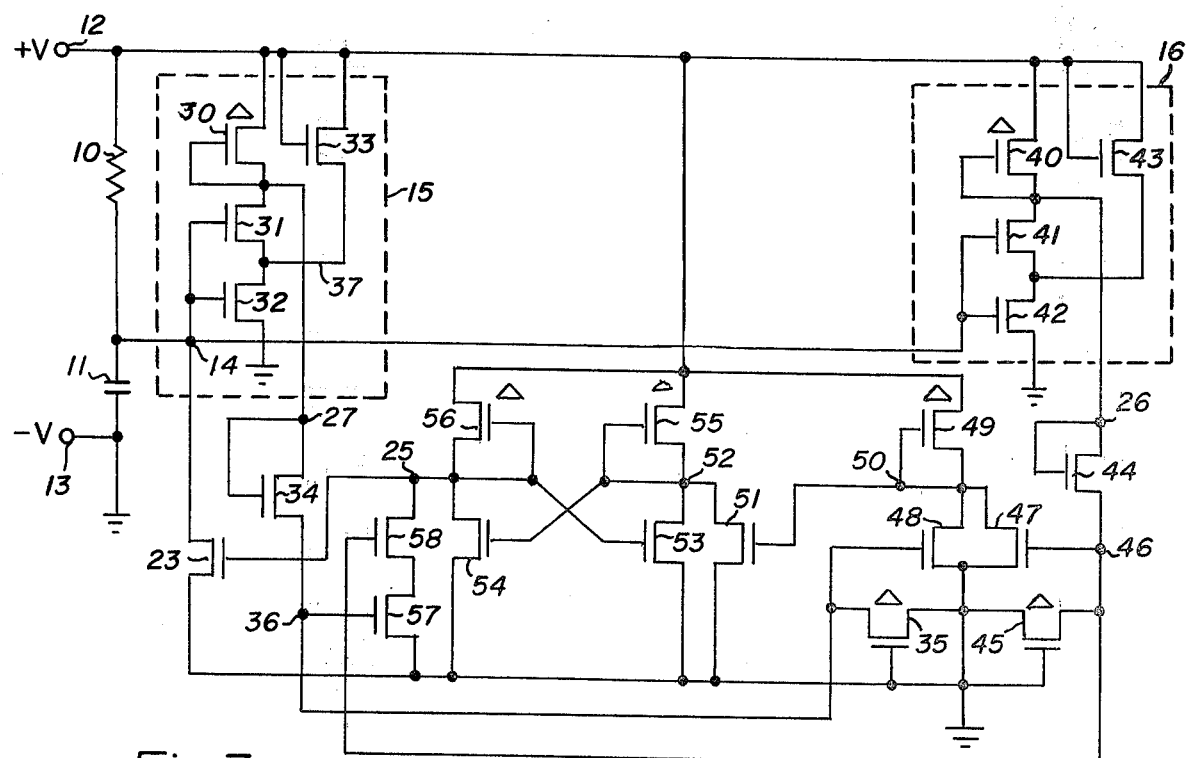
Fig_3

ACCURATE SINGLE PIN MOS RC OSCILLATOR

BACKGROUND OF THE INVENTION

Single pin oscillators are desirable in integrated circuit (IC) configurations. A basic oscillator is contained within the IC but the frequency determining components are external to the IC to avoid committing the device to a restricted frequency range. Also, since the external components can be manufactured or selected to any desired tolerance, the frequency tolerance is not confined to the IC. Since the frequency determining element is external, at least one pin must be added to the IC housing. Desirably only one pin is added to those already needed to operate the IC. This is usually accomplished by employing one or more of the other pins for plural function.

Previous attempts have been made to connect an RC combination to an IC to provide the oscillator function. Basically the resistor and capacitor are series connected between the power supply terminals. The juncture of the resistor and capacitor is connected to a separate IC input pin. The IC periodically discharges the capacitor after it has been charged to a particular threshold. Thus the circuit oscillates between ground potential and some IC-established threshold potential. One difficulty with this approach is that the IC produced threshold is a function of the power supply potential. Thus, oscillator frequency is related to potential unless some form of compensation is employed. Such compensation is difficult and often is effective over only a limited range of potentials.

Another difficulty is associated with IC manufacture. Process variables are always experienced to some degree. Since the threshold potential is internally set, it will be subject to variation from one IC to the next and from one batch of IC's to the next batch.

SUMMARY OF THE INVENTION

It is an object of the invention to provide an IC suitable for use as a single pin RC oscillator in which the frequency of oscillation is independent of process variables as well as applied operating potential variation.

It is a further object of the invention to provide an IC oscillator that operates on the difference between a pair of thresholds that will track each other with process variables, thereby producing an oscillator having a frequency more uniquely determined by external components.

These and other objects are attained in a circuit configured as follows. An external resistor and capacitor are series connected across the power supply terminals of an IC. The juncture is connected to the IC input on a single pin. A switch is coupled across the capacitor so that when the switch is on, the capacitor will discharge and when the switch is off, the capacitor charges through the resistor. The impedance of the switch is made much smaller than the value of the resistor so that circuit timing is little influenced by switch impedance. A pair of inverters having similar but different threshold values is coupled to the input pin. The inverter outputs are coupled to the two inputs of a NOR gate and to the two inputs of an AND gate. The NOR gate output acts to reset a latch and the AND gate output sets the latch. The latch is coupled to control the operation of the switch. The circuit is configured so that the switch is off as long as the capacitor charge is below the thresholds of both inverters. When both thresholds are exceeded, the switch is turned on. As the capacitor charges to the higher of the two threshold values, the switch turns on, thus discharging the capacitor. When the capacitor has discharged to the lower of the two thresholds, the switch will turn off and the capacitor will again charge. The charge will oscillate between the two thresholds so the RC time constant will set the oscillator frequency. Since the two inverters are slightly different in terms of threshold values and the threshold values will vary as a fabrication process variable, the two thresholds will vary in the same direction so that the difference will remain constant. Thus, the oscillator frequency will not be influenced by process variables that tended to profoundly influence the prior art circuits.

In terms of the applied potential, the two inverters react in the same way but, since the thresholds are different, one will vary more than the other. This variation in threshold difference will offset the frequency change that normally accompanies a voltage change. Thus, the circuit is frequency dependent only upon the values of the externally connected components.

BRIEF DESCRIPTON OF THE DRAWING

FIG. 1 is a logic diagram of the circuit of the invention;

FIG. 2 is a chart showing the sequence of logic states of various nodes of FIG. 1; and FIG. 3 is a schematic diagram of a circuit used to practice the invention.

DESCRIPTION OF THE INVENTION

FIG. 1 is a logic diagram of the circuit employing the invention. The conventional resistor 10 and capacitor 11 are connected in series between the power supply terminals 12 and 13 labeled $+V$ and $-V$ respectively. This power supply convention is for N-channel MOS transistors. If p-channel transistors are employed, the $+V$ and $-V$ designations would be inverted for terminals 13 and 12 respectively.

At the start of the power up state, which will be called state I, capacitor 11 will charge through resistor 10 toward the potential at terminal 12. Thus, the potential at node 14 rises with time from zero, or at least some low value. A pair of inverters 15 and 16 are coupled to mode 14 and are designated as having two different threshold values, $V_{T1}$ and $V_{T2}$ respectively. While either one can have the higher threshold potential, the following discussion will assume that $V_{T1}$ is below $V_{T2}$. Thus, as the potential at node 14 rises, the output of inverter 15 will go low at $V_{T1}$. As node 14 rises still further, inverter 16 will go low at $V_{T2}$. In the initial state I where the potential at node 14 is below both $V_{T1}$ and $V_{T2}$, the outputs of both inverters 15 and 16 will be high. Thus, AND gate 21 will have a high output on node 22. At the same time NOR gate 17 produces a low output on node 24. These conditions set latch 18, which consists of cross coupled NOR gates 19 and 20. The output of latch 18 on node 25 will be low and transistor 23 will be off.

When the potential at node 14 rises above $V_{T1}$, the circuit goes to state II. In this state inverter 15 will be on and node 27 low. The output of AND gate 21 (node 22) goes low. However, since the output of NOR gate (node 24) remains low (because inverter 16 is still high), latch 18 will remain in its set state. Thus, in state II, the capacitor will continue to charge.

As node 14 continues to rise, a level, $V_{T2}$ will be reached where inverter 16 turns on. At this time both inputs to NOR gate 17 are low and node 24 goes high. This is state III. In this state, latch 18 is reset and node 25 goes high to turn transistor 23 on. Capacitor 11 will then rapidly discharge through transistor 23 toward zero. As soon as capacitor 11 starts to discharge, the circuit is in State IV. The input at node 14 will be below $V_{T2}$ which means that inverter 16 output is high at node 26. NOR gate 17 will maintain node 24 low but, since the latch was reset, this will have no effect. Thus, capacitor 11 will continue to discharge until node 14 drops below $V_{T1}$, at which time state V is invoked. When inverter 15 goes off, node 27 goes high and, since node 26 was already high, AND gate 21 comes on and node 22 goes high to set latch 18, thereby driving node 25 low and turning transistor 23 off. Immediately capacitor 15 will again start to charge and state I is invoked.

In FIG. 2, a table summarizing the above is shown. The nodes are shown as being at 1 or 0, depending upon its being in its high or low condition. Starting in state I, the various node conditions are shown. Capacitor 11 charges in states I and II. The capacitor discharges in states III and IV. In state V, the circuit reverts to state I and the sequence repeats as long as the circuit is on. Since the circuit charges as a function of the resistor 10 - capacitor 11 time constant and rapidly discharges, the R-C value, in combination with $V_{T1}$ and $V_{T2}$, sets the frequency.

FIG. 3 is a schematic diagram of a circuit that conforms to the logic diagram of FIG. 1. N-channel MOS field effect transistors are shown. Except where the triangular symbol denotes a depletion device, the transistors are of the enhancement variety. It will be noted that the depletion devices all have their gates returned to their sources so the device acts as a resistor.

Inverter 15 is made up of transistors 30–33. Its input is taken from node 14 and its output appears at node 27.

Transistors 30, 34, and 35 form a voltage divider across the power supply (from +V to −V or ground). Transistors 30 and 35 are depletion devices and transistor 34 is an enhancement device. The voltage division in the absence of other circuit elements will be determined by the device ratioing. Typically, transistor 34 will be smallest so that node 27 will operate about one threshold below +V and node 36 will operate at about one threshold above ground when the divider is on or at logic one.

When both transistors 31 and 32 are on, node 27 will drop to where transistor 34 will be off and transistor 35 pulls node 36 close to ground potential. This constitutes a logic zero on nodes 27 and 36.

The threshold action of the inverters 15 and 16 will now be described with reference to inverter 15. When the voltage on node 14 is below threshold, transistor 32 will be off and transistor 33 will pull node 37 to about one threshold below +V. Transistor 31 will have its source and drain both near +V and will be off. As the potential at node 14 rises, at some point transistor 32 will turn on. The potential on node 37 will fall because transistor 32 and 33 comprise an enhancement inverter. The grain of this inverter will be a function of the ratio between transistors 32 and 33. Making 33 smaller will cause the rate of rise at node 37 to be greater. When the source of transistor 31 has dropped to where it starts to turn on, the potential on node 27 will fall and this turns transistor 31 on harder, which still further causes the potential at node 27 to fall. Thus, a regenerative or snap action sets in once transistor 31 turns on and both trnasistors 31 and 32 turn full on to force node 27 low to a logic zero state. It can be seen that the ratioing of transistors 32 and 33 determines the threshold of the circuit and once the threshold is exceeded, transistor 33 no longer has any control action because its source is operating close to ground potential and it merely acts as a resistor.

In the other direction, as the potential on node 14 falls, transistor 32 will start to go out of conduction. This causes node 37 to rise which turns transistor 31 off and allows transistor 33 to pull node 37 still more positive, further reducing conduction in transistor 31. This allows node 27 to snap back to its previously described logic one state.

From the above, it is clear that the threshold circuit has a snap action as far as its output is concerned so that its output is at either zero or one, depending upon whether the input is above or below the threshold voltage which is set by a simple device area ratio.

Transistors 40–43 constitute inverter 16, which operates exactly as does inverter 15. Its output on node 26 snaps between logic one and zero, depending upon whether node 14 is below or above the threshold set by the ratioing of transistors 42 and 43. In the invention the ratio of transistors 42 and 43 is made slightly but significantly different from the ratio of transistors 32 and 33. While it does not matter which threshold is lower, the condition associated with the description of FIG. 1 assumed inverter 15 to have a lower threshold than inverter 16.

If the inverter thresholds are close together, it can be seen that the potential swing at node 14 will be small. In fact it is equal to the threshold difference value. However, since the other circuitry is digital, an output, which could be taken on any of nodes 26, 27, 24, 22, 25, 36, or 46, will be of constant logic levels of zero or one. For example, at node 25 logic zero will be close to ground or −V potential while a logic one will be close to +V.

Since the threshold values $V_{T1}$ and $V_{T2}$ are set close together and are determined by device size, it is clear that manufacturing variables will cause $V_{T1}$ to track $V_{T2}$ closely. Thus, while typical prior art R-C oscillators experience substantial frequency variation between IC chips, the circuit of the invention can maintain a frequency that is highly reproducible between IC chips. Whereas the best prior art oscillators display a ±30% variation in frequency between IC chips, the invention yields an accuracy of better than ±10%, an improvement of better than three to one.

In terms of frequency variation in response to applied voltage, it can be seen that as +V is increased, capacitor 11 will tend to charge more rapidly through resistor 10. That is, for a given set of components, node 14 will rise to a higher voltage in a given period of time as +V increases. However, as +V increases, the threshold difference between inverters also increases, thereby increasing the swing of voltage at node 14. This increase in swing requires a greater time and thus tends to offset the more rapid charge. This action greatly reduces the frequency sensitivity of the circuit to applied supply voltage.

To complete the description of the circuit of FIG. 3, it will be noted that transistors 40, 44, and 45 form a divider between +V and −V as did transistors 30, 34, and 35 described above. Thus, when inverter 16 is on, node 46 will be at logic zero close to ground potential If at the same time, node 36 is at logic zero, both transistors 47 and 48 will be off and transistor 49 will pull node 50 close to +V. This will turn transistor 51 on and pull node 52 close to ground potential. If latch 18 was previously reset, where node 52 was high, this will set the latch. It will be noted that cross coupled transistors 53 and 54 with load transistors 55 and 56 form a bistable flip-flop or latch. If the latch is set and node 25 low, or at logic zero, it can be seen that the state of transistors 57 and 58 is of no consequence. However, if latch 18 is in its reset state and node 25 is high, transistors 57 and 58 can if turned on together, act as a set trip. This is the AND gate 21 function of FIG. 1. Transistors 47, 48, and 49 perform the FIG. 1 NOR gate 17 action.

The invention has been described and a circuit useful for implementing it has been detailed. Clearly there will be numerous alternatives and equivalents that will occur to a person skilled in the art. For example, as pointed out above, the N-channel devices could be replaced by P-channel devices (and the power supply polarity reversed). Other combinations of enhancement and depletion devices could be employed and CMOS elements could be used to implement the various functions. Accordingly, it is intended that the scope of the invention be limited only by the following claims.

I claim:

1. An integrated circuit oscillator for use with an externally connected resistor-capacitor combination, said integrated circuit including a plurality of package pins, two of which are adapted for coupling to the terminals of a source of supply potential, said resistor-capacitor combination being adapted for series connection across said two pins with the juncture therebetween adapted for coupling to an integrated circuit package input pin, said integrated circuit comprising:

a pair of inverters having their inputs coupled to said input pin, said inverters being constructed to have similar but different threshold values;

switch means coupled to said package pins adapted for connection to said capacitor, said switch means when on being capable of discharging said capacitor; and logic means comprising a two input AND gate having its inputs coupled to the outputs of said inverters, a two input NOR gate having its inputs coupled to the outputs of said inverters, and a latch having an output coupled to aid switch means, a reset input coupled to the output of said NOR gate and a set input coupled to the output of said AND gate, said logic means acting to turn said switch means on when the potential on said input pin exceeds the thresholds of both of said inverters and to turn said switch means off when the potential on said input pin is less than the thresholds of both of said inverters.

2. An RC oscillator comprising:

means for coupling a resistor and capacitor in series across a potential source;

a pair of inverters coupled to said capacitor, said inverters having threshold voltages that are different and that constitute an appreciable fraction of the value of said potential source;

a two input AND gate having its inputs coupled to the outputs of said pair of inverters;

a two input NOR gate having its inputs coupled to the outputs of said pair of inverters;

a latch having set and reset inputs and an output, means for coupling said latch set input to the output of said AND gate;

means for coupling said latch reset input to the output of said NOR gate;

a transistor switch coupled across said capacitor terminals and having a control terminal that can render said switch conductive and non-conductive in response to the presence and absence of an applied control voltage; and means for coupling said output of said latch to said control terminal of said transistor switch whereby said latch when set renders said transistor switch non-conductive and said capacitor charges until the thresholds of both inverters are exceeded whereupon said latch is reset to render said transistor switch conductive to discharge said capacitor.

3. The oscillator of claim 2 wherein said pair of inverters are configured to have similar threshold voltage levels and contain components ratioed to produce different threshold values.

4. The oscillator of claim 3 wherein each of said inverters comprises a pair of transistors having a size ratio which sets the input voltage threshold and said ratio is made different in the two circuits of said pair.

5. The oscillator of claim 4 wherein each of said inverters includes regenerative feedback such that when said threshold is reached, said inverter is rapidly driven into its maximum conduction state.

* * * * *